(12) United States Patent
Tian et al.

(10) Patent No.: US 8,207,478 B2
(45) Date of Patent: Jun. 26, 2012

(54) METHOD AND APPARATUS FOR RAPID THERMAL PROCESSING AND BONDING OF MATERIALS USING RF AND MICROWAVES

(76) Inventors: Yonglai Tian, Fairfax, VA (US); Mark Y. Tian, Fairfax, VA (US)

( * ) Notice: Subject to any disclaimer, the term of this patent is extended or adjusted under 35 U.S.C. 154(b) by 0 days.

(21) Appl. No.: 13/190,447

(22) Filed: Jul. 25, 2011

(65) Prior Publication Data

US 2011/0278284 A1  Nov. 17, 2011

Related U.S. Application Data

(60) Continuation of application No. 12/472,079, filed on May 26, 2009, now abandoned, which is a division of application No. 11/273,757, filed on Nov. 15, 2005, now Pat. No. 7,569,800.

(60) Provisional application No. 60/627,472, filed on Nov. 15, 2004.

(51) Int. Cl.
   *H05B 6/68* (2006.01)

(52) U.S. Cl. ........ 219/704; 219/702; 219/710; 219/665; 219/666

(58) Field of Classification Search .......... 219/660–704, 219/603, 612, 633, 764, 765; 438/455–459
   See application file for complete search history.

(56) References Cited

U.S. PATENT DOCUMENTS

| | | | | |
|---|---|---|---|---|
| 3,867,606 | A | * | 2/1975 | Peterson ........................ 219/748 |
| 4,157,464 | A | * | 6/1979 | Smith et al. .................... 219/706 |
| 4,494,539 | A | * | 1/1985 | Zenitani et al. ................. 606/33 |
| 4,672,980 | A | * | 6/1987 | Turner ........................... 607/154 |
| 5,046,495 | A | * | 9/1991 | Takahashi et al. ............. 607/102 |
| 5,321,222 | A |   | 6/1994 | Bible et al. |
| 5,364,392 | A | * | 11/1994 | Warner et al. .................. 606/34 |
| 5,902,506 | A | * | 5/1999 | Scott et al. ..................... 219/608 |
| 6,905,945 | B1 |  | 6/2005 | Barmatz et al. |
| 6,951,222 | B2 |  | 10/2005 | Liao |

(Continued)

OTHER PUBLICATIONS

U.S. Appl. No. 12/472,079—Non-Final Office Action mailed Mar. 24, 2011.

(Continued)

*Primary Examiner* — Henry Yuen
*Assistant Examiner* — Jianying Atkinsson
(74) *Attorney, Agent, or Firm* — Miles & Stockbridge P.C.; Michael A. Minter, Esq.

(57) ABSTRACT

A method and apparatus for rapid and selective heating of materials using variable frequency RF and microwaves. The apparatus uses variable frequency solid state electronics as a microwave power source, a novel microwave heating head to couple microwave energy to the target materials and a match-up network to tune the frequency and impedance match between the microwave source and the load. An electronic and computer measurement and control system is employed to monitor and control the microwave heating process. The method teaches the use of inductive microwave coupling for thin conductive materials such as metal film and impurity doped silicon wafers. The method also teaches the use of capacitive microwave coupling for dielectric material such as glass and ceramics. The method further teaches the use of rapid and selective heating of heterostructure for bonding and sealing of mems and integrated circuits. The method and apparatus can provide ultra-high heating speed along with ultra-high heating temperatures for rapid thermal processing of semiconductors and other materials. It also allows the use of bonding materials with high melting temperature for strong bonding and sealing of mems and IC devices. The apparatus further provides for high interconnection density of integrated circuits as connections are made without the use of solder bumps.

15 Claims, 13 Drawing Sheets

U.S. PATENT DOCUMENTS

| | | | |
|---|---|---|---|
| 6,951,798 B2 | 10/2005 | Booske et al. | |
| 7,221,241 B2 | 5/2007 | Lutz et al. | |
| 7,312,427 B2 | 12/2007 | Suenaga et al. | |
| 2001/0035406 A1* | 11/2001 | Ryan et al. | 219/634 |
| 2005/0167047 A1 | 8/2005 | Huff et al. | |

OTHER PUBLICATIONS

U.S. Appl. No. 11/273,757—Notice of Allowance mailed Feb. 26, 2009.

U.S. Appl. No. 11/273,757—Non-Final Office Action mailed Sep. 18, 2008.

U.S. Appl. No. 11/273,757—Restriction/Election Requirement mailed Jan. 25, 2008.

U.S. Appl. No. 11/273,757—Non-Final Office Action mailed Jul. 17, 2007.

U.S. Appl. No. 11/273,757—Restriction/Election Requirement mailed Mar. 13, 2007.

* cited by examiner

Table 1. Variation of temperature with time and input power for microwave rapid heating of wide bandgap SiC substrates

| Time (Second) | Temperature (°C) of SiC substrate under various microwave power P | | | | |
|---|---|---|---|---|---|
| | P = 60W | P = 80W | P = 100W | P = 130W | P = 150W |
| 0 | Room temperature | | | | |
| 1 | 614 | 810 | 940 | 1180 | 1400 |
| 2 | 900 | 1160 | 1370 | 1615 | 1910 |
| 3 | 1110 | 1370 | 1575 | 1825 | 2110 |
| 4 | 1250 | 1470 | 1740 | 1910 | 2200 |

Table 2. Variation of temperature with time and input power for microwave rapid heating of Arsenic (As) doped silicon substrates.

| Time (Second) | Temperature (°C) of B doped Si substrate under various microwave power P | | | | | |
|---|---|---|---|---|---|---|
| | P = 40W | P = 60W | P = 80W | P = 100W | P = 130W | P = 150W |
| 0 | Room temperature | | | | | |
| 1 | 770 | 900 | 1050 | 1250 | 1310 | 1410 |
| 2 | 900 | 1090 | 1240 | 1380 | 1410 | 1410 |
| 3 | 940 | 1130 | 1310 | 1410 | 1410 | |
| 4 | 960 | 1145 | 1320 | | | |

Figure 8

Table 3. Variation of temperature with time and input power for microwave rapid heating of gold coated silicon substrates.

| Time (Second) | Temperature (°C) of gold coated Si substrate under various microwave power P | | | | |
| --- | --- | --- | --- | --- | --- |
| | P = 60W | P = 80W | P = 100W | P = 120W | P = 140W |
| 0 | Room temperature | | | | |
| 1 | 514 | 560 | 639 | 756 | 865 |
| 2 | 737 | 800 | 911 | 1003 | 1072 |
| 3 | 800 | 862 | 991 | 1102 | 1160 |

METHOD AND APPARATUS FOR RAPID THERMAL PROCESSING AND BONDING OF MATERIALS USING RF AND MICROWAVES

CROSS-REFERENCE TO RELATED APPLICATIONS

This application claims the benefit of U.S. Non-provisional application Ser. Nos. 12/472,079 (currently pending) and 11/273,757 (now U.S. Pat. No. 7,569,800), filed May 26, 2009 and Nov. 15, 2005, respectively, and further claims the benefit of U.S. Provisional Application No. 60/627,472, filed Nov. 15, 2004.

BACKGROUND

1. Field of Invention

The present invention relates to rapid thermal processing and bonding of materials using radio frequencies (RF) and microwaves, and more specifically to a method and apparatus for rapid heating of materials using solid state variable frequency RF/microwave sources. The invention further relates to a method for rapid thermal processing of semiconductors and materials using the present RF/microwave apparatus. The present invention also relates to a method of selectively heating portions of materials using the RF/microwave apparatus of the invention, and more specifically to the bonding and sealing of microelectro-mechanical systems (mems) and integrated circuits (IC/microchips) using the present method of RF/microwave rapid and selective heating.

2. Related Art

Advantages of Rapid RF/Microwave Heating

There are many applications for using microwave energy for thermal processing of materials. Microwave heating has an advantage of rapid heating over conventional heating techniques. Conventional heating is slow because the heat is applied to the surface of an object. It takes time to transfer the heat from the surface to the interior of the object through thermal conduction. In contrast, microwave heating is fast because microwave can penetrate into objects and heat the interior and exterior simultaneously.

Microwave-Materials Interaction

The mechanisms of microwave heating are based on the interaction between the electromagnetic field and the targeted materials. There are three forms of interaction in general, namely: (1) materials with low complex dielectric constant are poor microwave absorbers and not good for microwave heating; (2) materials with high complex dielectric constant are strong microwave absorber and very good for microwave heating; and, (3) conductors such as metals reflects microwave so not good for microwave heating in general. However the magnetic filed of microwaves can penetrate a skin depth of the conductor's surface and induce an eddy current to generate heat therein. The skin depth of high conductive metals such as Au, Ag and Cu is about 0.6 to 6 μm within RF/microwave frequency range from 100 MHz to 10 GHz. Therefore when the dimension of a conductor becomes the same scale or less of the skin depth, such as in the cases of the conductive interconnection in IC chips and doped impurity layer in Si wafers, the heating effect of eddy current is significant and the thin conductor layer is no longer a microwave reflector but a strong microwave absorber. The thin layer of a conductor becomes a very good candidate for microwave heating.

Selective Heating

When microwave power radiates on a heterostructure (comprised of different materials), such as a strong microwave absorber and a poor microwave absorber, microwaves will selectively heat up the strong microwave absorber while leaving negligible heating effect on the materials of low microwave absorption.

Methods and Apparatus for Microwave Rapid Heating

It is known that the heating rate of RF/microwave thermal processes depends on the density of RF/microwave energy to be coupled into the materials. Therefore two important conditions for a rapid RF/microwave heating are (1) a high intensity of electromagnetic (EM) field and (2) EM energy to be efficiently coupled into the targeted materials. The methods for coupling EM energy into materials can be characterized as three classes:

1. Capacitive coupling, where energy is coupled into materials via electric E fields;
2. Inductive coupling, where energy is coupled into materials via magnetic H fields: and,
3. Cavity (EH) coupling where energy is coupled into materials via a combination of E and H fields.

Cavity coupling is the most widely used method in microwave heating processes. A microwave heating furnace is typically constructed in the form of either a single mode cavity or a multi-mode cavity operating at a fixed frequency. A single mode cavity can generate a much higher intensity of electromagnetic filed than that of a multi-mode and therefore is more favorable in fast heating processes. Heating rates as high as 10-100° C./sec are achievable using single mode cavity whereas the heating rate in a multi-mode cavity is relative low. There are some technical barriers for further increasing the heating rate to well above 100° C./sec level using cavity techniques used in prior art. First the use of a fixed frequency source leads to a mismatch in resonant frequencies between the RF/microwave source and the loaded cavity when the frequency of the loaded cavity shifts with the temperature changes during a thermal process. Second, the cavity is mechanically tuned so its response to coupling change is slow which results in a slow down of the heating rate.

There are other limitations of cavity coupling techniques in the prior art. One of the significant problems is the arcing and the breakdown of plasma inside the cavity as the input RF/microwave power reaches a threshold level to breakdown the air. Especially in the presence of conductive materials in the cavity, such as metal, the electric field is significantly enhanced at the edge of conductive materials so the arcing may occur at a much lower power level than that of the threshold. The limitation of input power due to the arcing problem significantly limits the ability of using cavity techniques to achieve high heating rate and high heating temperature.

Another limitation of cavity techniques used in the prior art is that the size of the load must be smaller than the size of the cavity. Since the dimension of a single mode cavity decreases with an increase of the operating frequency, the size of the cavity operating at high frequency may not be large enough when the size of load is big, e.g. an 8" silicon wafer.

Induction coupling method is known in prior art and has been widely used in heating conductive materials. The mechanism of the inductive heating is based on the thermal effect of 'eddy current' induced by the magnetic field of an AC current. However, the use of induction heating in prior art is limited in low frequency levels, ranged from 50 Hz to less than 50 MHz. None of the induction heating methods in the prior art has used RF and microwave frequency beyond 100 MHz. Induction heating in not suitable in heating low conductive materials and insulators due to the lack of eddy current.

3. Applications

Rapid Thermal Processing (RTP) of Semiconductors and Materials

An important application of microwave rapid heating techniques is rapid thermal processing (RTP) of advanced materials and semiconductors such as activation annealing of ion implanted wafers for SiC and GaN wide bandgap semiconductors and formation of ultra shallow junction for CMOS devices. High annealing temperature and extremely short annealing time are two critical conditions for these RTP applications. By increasing the annealing temperature while simultaneously reducing the time, high percentage of electrical activation can be achieved and will lead to low sheet resistance. Meanwhile, the short annealing time will minimize the diffusion in CMOS devices to allow ultra shallow junction formation and eliminate surface evaporation in SiC wafers to reduce surface roughness. For instance, the temperature required for post-implant annealing of SiC semiconductor may range from 1500 to 2000° C. along with short annealing time ranged from a few minutes to a few seconds. None of conventional heating methods used in prior art can meet these requirements. Limited by the slow heating rate, conventional furnace heating methods can only perform SiC annealing at temperatures below 1700° C. with annealing time longer than 5 minutes. The relative low annealing temperature of below 1700° C. will result in ineffective recovery of crystal and low activation efficiency. The halogen lamp based commercial RTP systems can only operate at below 1300° C. which makes them incapable for post implant annealing of SiC.

Very high heating and cooling rates ranged from 100° C./sec to well beyond 1000° C./sec are required for RTP of CMOS shallow junction within temperature range of 1150 to 1350° C. The halogen lamp based commercial RTP methods are currently used for RTP of CMOS shallow junction which can operate at heating rate of 100-300° C./sec within annealing temperatures below 1300° C. The best current lamp based RTP systems appear to be viable to shallow junction processes for current 100 nm technology node, although they may be very close to the limit of their capability. However, they will no longer meet the challenges in making ultra-shallow junctions associated with next generation CMOS in sub-65 nm regime or smaller where ultra-high heating rates well above 1000° C./sec are required.

Bonding and Packaging of Mems and IC Devices

The packaging of mems and IC chips generally requires the bonding of the components and the connecting of the internal circuits with external pins. The soldering method is a the most widely used technique for IC and mems packaging where low melting alloys such as Pb—Sn are used as the solder materials. FIG. 1 illustrates a typical example of Flip-Chip solder bonding in connecting the microchip to a substrate where the substrate may be either a print circuit board (PCB) or direct chip attachment (DCA). Two gold pads are first plated on the bonding areas of the silicon chip and substrate. The solder material is then placed between the two pads. By melting the solder to form a metal bump between the pads as shown in FIG. 1, the silicon chip and the substrate are bonded together.

As the demands on miniaturization of IC chips increases, high-density interconnections and a high number of I/O requirements are indispensable in the IC industry. The large space occupied by the solder bumps becomes a limited fact for further shrinkage of the IC package. Another problem with the soldering method is the high residual stress at the bonding interfaces caused by the large coefficient of thermal expansion (CTE) mismatch between the solder bump and the substrates. The high residual stress may induce delamination and cracks in the package during the operation in thermal cycles.

Many mems applications may require special bonding qualities such as high bonding strength, hermetic sealing, chemical resistance and high service temperature. Bonding strength is very important for the mechanical function of many mems. Mems components may also operate under different environment, temperature and vacuum/pressure conditions where hermetic sealing, chemical resistance and high service temperature become the necessary bonding requirements. Low temperature solder bonding can no longer meet these requirements because of its weak mechanical strength, low melting temperature and poor chemical resistance. Other bond techniques and bonding materials are needed. For instance, some noble metals such as Au, Cr, Ni, Pt or glass and ceramics are very good candidates as the bonding materials because of their excellent high temperature properties and chemical resistance. These materials require much higher bonding temperature than that of soldering because of their high melting temperature.

A number of bonding techniques have been developed for using bonding materials other than lower temperature solders, such as Au—Si eutectic brazing, glass-Si fusion bonding and anodic bonding. These bonding techniques have significantly improved the mems bonding quality to meet the special requirements of various applications. However, all these existing bonding techniques are global heating methods so entire mems are exposed to high temperatures for long processing times which may lead to some damages or changes of the microcircuits and microstructure which were already placed on the mems components.

Thus it is important to develop alternative approaches to overcome the shortcomings of the existing techniques for these applications. What is needed is a method for rapid heating up of materials to very high temperatures for RTP of materials and semiconductors. What is also needed is a method for strong bonding and hermetic sealing of mems with bonding materials of high melting temperatures or chemical resistance. What is further needed is a method for small size bonding of IC chips without using solder bumps.

SUMMARY

To overcome the limitations in the prior art described above, the present invention discloses a method and apparatus for rapid and selective heating of materials using variable frequency RF/microwave sources. The method and apparatus can provide ultra-high heating speed along with ultra-high heating temperatures for RTP of materials that other RTP techniques can not perform. It also will provide a new approach to meet the challenges of high interconnect density of integrate circuits and high bonding quality for mems applications.

The primary objective of the present invention is to disclose a RF/microwave apparatus which is capable of rapid and selective heating of materials to very high temperature. The heating rate depends on how efficiently the RF/microwave energy is coupled into the targeted materials. The RF/microwave apparatus of the present invention has a number of advantages which overcome the limitation of prior art in microwave heating techniques and significantly improves the efficiency of microwave coupling.

Another objective of the present invention is to teach a method for rapid thermal processing of semiconductors and materials using an RF/microwave apparatus. Experiments based on this method for rapid heating of SiC wafers and Arsenic (As) doped Si wafers have demonstrated that the RF/microwave apparatus of this invention has the capability of achieving ultra-high temperature of over 2000° C. and an ultra-fast heating rate of 2,000° C./second.

Another objective of the present invention is to teach a new approach of bonding and sealing of mems and IC devices using RF/microwave rapid and selective heating apparatus of this invention. This new approach will allow the use of bonding materials of high melting temperature or chemical resistance such as noble metals, for strong bonding and hermetic sealing of mems and IC devices. The new approach also will eliminate the solder bumps in flip-chip and BGA bonding of IC devices and as a result, achieve significantly higher interconnect density.

According to one aspect of the invention, inductive coupling and capacitive coupling methods are used to replace the cavity coupling method in prior art to transfer RF/microwaves from the source to the load. The inductive coupling is good for thin conductive materials such as metal film or impurity doped silicon wafers where the magnetic field will induce eddy current to heat the conductive materials. The capacitive coupling is good for dielectric materials such as glass and ceramics where the electric field will heat the high dielectric loss materials.

The use of inductive coupling or capacitive coupling methods in the heating head of the RF/microwave apparatus of the present invention is one of the key factors in providing many advantages over the cavity coupling method used in the prior art. These advantages are: (1) different coupling mechanisms are used for different materials so the coupling efficiency is optimized; (2) the RF/microwave head can be closely placed on the top of the targeted heating area so the heating areas are exposed to the strongest electromagnetic filed; (3) the configuration of the conductive coil or capacitive plates in the RF/microwave heating head can be specially designed to match with the pattern of the heating areas so intensive RF/microwave energy will only be delivered to the focused areas while no other areas will be affected by the RF/microwave radiation; (4) there is no arcing or plasma breakdown problem which means the inductive coupling method can deliver significantly higher power density to the load than the cavity coupling method can. As a result, significantly higher heating rates and higher heating temperatures can be achieved); and, (5) there is no limitation on the size of the load According to another aspect of the invention, variable frequency solid state electronics, instead of a fixed frequency magnetron, are used as the RF/microwave power source in the present invention. The variable frequency source allows a broad bandwidth from which to choose the optimal operating RF/microwave frequency. It also provides the flexibility of sweeping the source frequency during the thermal processes to compensate the resonant frequency shift of the load caused by the temperature change of the specimen. In addition, the variable frequency source has the capability of generating pulsed or modulated RF/microwave power for optimal energy dissipation. In comparison with the traveling wave tube (TWT) variable frequency source used in prior systems, the present solid state electronic source is much cheaper, more compact and easier for electronic control.

According to another aspect of the invention, a match-up network is specially designed for tuning both resonant frequency and impedance of the loaded RF/microwave heating head to match with those of the RF/microwave power source. The L and C parameters can vary with the targeted specimens in order to maintain excellent coupling conditions for different applications. In contrast to the slow mechanical tuning of microwave cavities in the prior art, the present L and C components in match-up network can be electronically tuned so that there is no delay in tuning response time and a much higher heating rate can be achieved.

According to another aspect of the invention, a network analyzer and PC computer are introduced in the measurement system for monitoring, tuning and controlling the entire microwave and thermal processes. Since the rapid thermal processes must be completed in a very short time, e.g. a few seconds or less, it is very hard to tune and to control the processes manually. The combination of hardware and software realizes an automated measurement and control system with real-time feedback, which provides further flexibility, stability and reliability to the overall system.

According to another aspect of the invention, microwave rapid heating tests for SiC wafers was performed using the RF/microwave apparatus of this invention. Microwave power at a frequency of 402 MHz was applied to the target specimen of SiC wafers through an inductive coil, which was closely placed on the top of the targeted specimen. It took about 1 and 4 seconds for a SiC specimen to reach the temperatures of 1400° C. and 2200° C. respectively with 150 W input power. The average heating rate varies from 1400° C./sec to 550° C./sec depending on the target temperature. Higher heating rates are achievable with the present invention.

According to another aspect of the invention, microwave rapid heating of Arsenic (As) doped Si wafers have been performed using the RF/microwave apparatus of this invention. Microwave power with continuous sine waveform at a frequency of 406 MHz was applied to the target of As doped Si wafer through an inductive coil. It only took one second to heat the As doped Si wafer to its melting temperature of 1410° C. at power level of 150 W. The heating rate is about 1400° C./sec. The heating rate may be significantly increased if high power pulsed microwave sources can be used that will have great potential in meeting the challenges of RTP for next generation CMOS ultra-shallow junctions.

According to another aspect of the invention, rapid and selective heating of a heterostructure material of gold thin film coated silicon substrates is achieved using the method and apparatus of the invention. The heterostructure is formed by depositing Cr and gold thin films on the silicon substrate. Microwave power at a frequency of 906 MHz is applied to the target specimen through an inductive coil. The magnetic field of microwave power will induce a high eddy current in conductive layer of gold thin films and rapidly heat up the gold thin film to over its melting point of 1064° C. in 2-3 seconds with input microwave power of 120 to 140 Watts. Meanwhile the bulk of silicon substrate remains cool because of the fast heating speed and short heating time. The results of the tests demonstrate the capability of the RF/microwave apparatus of the present invention in selective heating heterostructure materials to high temperature at very high heating rate.

According to another aspect of the invention, two components of a mems micro-pump are rapidly bonded using the method and RF/microwave apparatus of the present invention. Gold thin films are deposited on the patterned bonding areas of the silicon substrates using PVD sputtering and lithographical methods. The two silicon substrates are stacked up with the gold coated areas face to face along with the alignment of the bonding areas. The two stacked substrates form a heterostructure where the gold is a strong microwave absorber and the silicon substrate is a weak microwave absorber. Microwave power of 904 MHz is coupled to the bonding target through an inductive coil. Since the silicon substrate is a low dielectric loss material and a weak microwave absorber, the input microwave power can penetrate through the top silicon substrate and dissipated in the thin gold layers in the middle of the sandwiched mems components through an induced eddy current. It takes only about 2-3 seconds to firmly bond the two components A and B of the mems micro-pump with microwave power level of 120-140 watts.

According to another aspect of the invention, a new approach for eliminating solder bumps in flip-chip and BGA bonding of IC chips has been proposed by directly bonding gold pads on chip to gold pads for pins using the apparatus of the present invention. An induction head can be placed on the top of IC microchip and eddy currents will be induced in the gold coated pads. The two pads will be bonded when the gold melting temperature of 1065° C. is reached. The heating rate must be very fast so the bonding can be completed in a very short time. Only the interface of the pads is melted while all other parts of the IC microchip are still cool and the microcircuits in the IC chip are preserved and unaffected. The elimination of the solder bumps will allow more extra space to be used to allocated more pins for higher interconnect density.

The method and RF/Microwave apparatus of the present invention may introduce several new opportunities for bonding and packaging of mems and IC devices, including: (1) Much higher temperatures can be applied to improve the bonding strength; (2) New bonding mechanisms such as brazing and fusion bonding, and new bonding materials, such as noble metals of Au, Cr, Ni, Pt and $SiO_2$ based glass can be used; (3) No pressure needs to be applied to the specimens during bonding which can significantly reduce the residual stress related damages; and, (4) Bonding is not limited at the outside surface of the body. Microwaves can penetrate into non-conductive or low conductive materials to perform bonding inside the body as demonstrated in the bonding of sandwiched mems components described above. (5) A new direct gold pad to gold pad bonding method for solderless Flip-Chip and Ball Grid Array (BGA) Bonding of IC Chips to achieve significantly higher interconnect density

BRIEF DESCRIPTION OF THE DRAWINGS

The invention of the present application will be described in detail with reference to the accompanying drawing(s), given only by way of example, in which:

FIG. 12 shows heating rate tables for silicon substrates that are achievable with the present apparatus;

DETAILED DESCRIPTION OF THE INVENTION

RF/Microwave Apparatus for Rapid and Selective Heating of Materials

Figure 1:
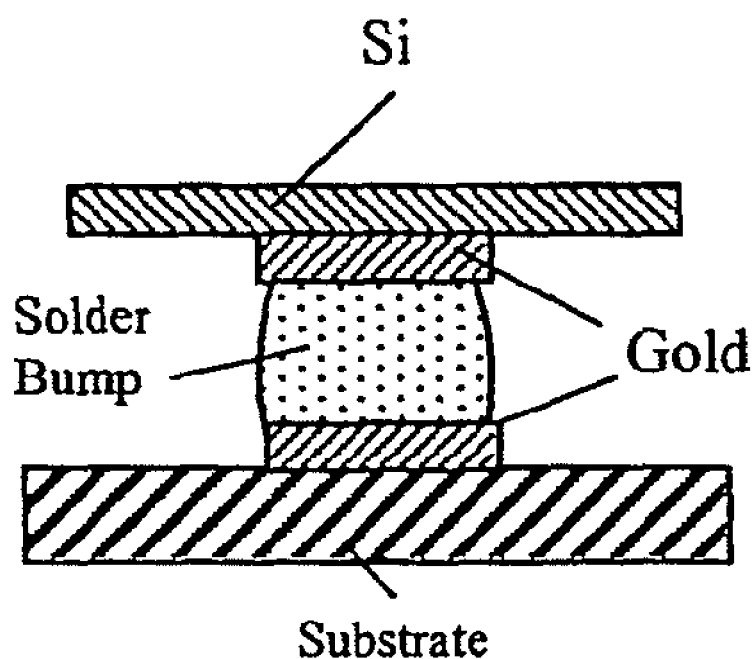
FIG. 1 shows a traditional (prior art) flip chip bond with solder bumps.
Figure 2:
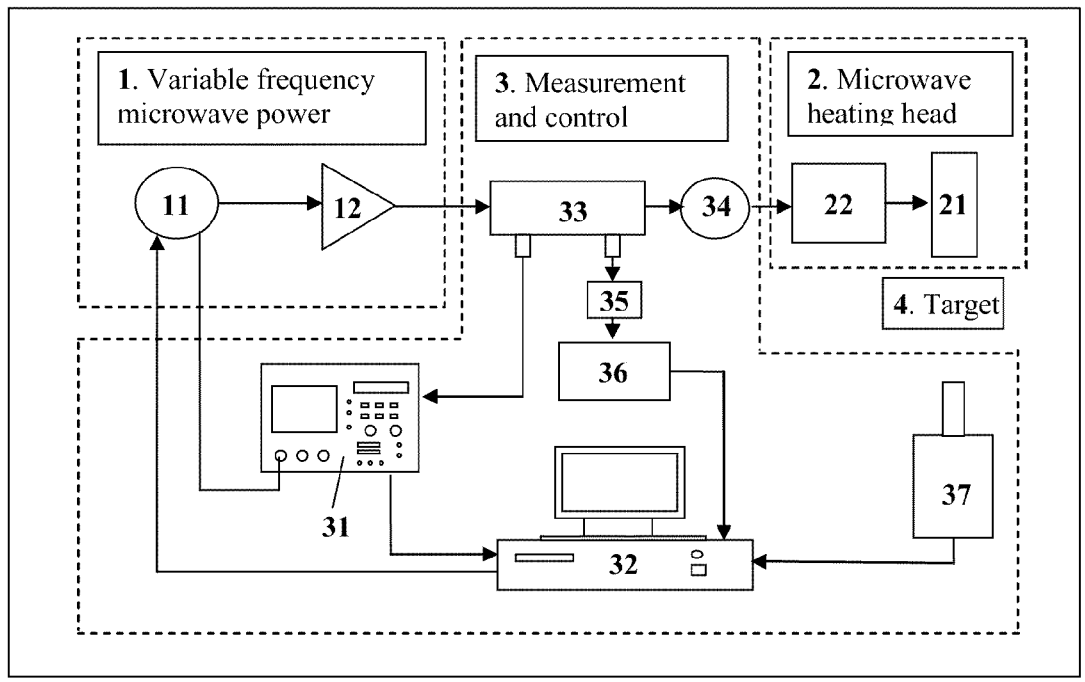
FIG. 2 is a block diagram of the present RF/microwave rapid heating apparatus.

One objective of the present invention is to disclose a RF/microwave apparatus which is capable of rapid and selective heating of materials to very high temperature. FIG. 2 is a block diagram of the RF/microwave apparatus for rapid heating of materials according to the present invention. This RF/microwave apparatus can be divided in to three main parts: the variable frequency RF/microwave power source 1; the RF/microwave heating head 2; and, the measurement and control system 3. RF/microwave power is generated from a variable frequency power source 1, which is driven by solid state electronics and coupled into a target specimen 4 through a RF/microwave heating head 2. A measurement and control system 3, which is placed between 1 and 2, is used for tuning, monitoring and controlling of the RF/microwave thermal processes.

Solid State High Power RF/Microwave Sources

Still referring to FIG. 2, the variable frequency RF/microwave power source 1 consists of a RF/microwave signal generator 11 and a RF/microwave power amplifier 12. High frequency signal is generated from the signal generator 11 and amplified by a RF power amplifier 12. The power amplifier 12 may be either a solid state RF power amplifier or a traveling wave tube (TWT) amplifier. The power source can sweep a certain bandwidth within a frequency range from 100 MHz to 20 GHz. Preferably, the driving frequency ranges from 300 MHz to 6 GHz. The output power is adjustable from 0 to several hundred watts and up.

Microwave Heating Head and Match-Up Network

Figure 3:
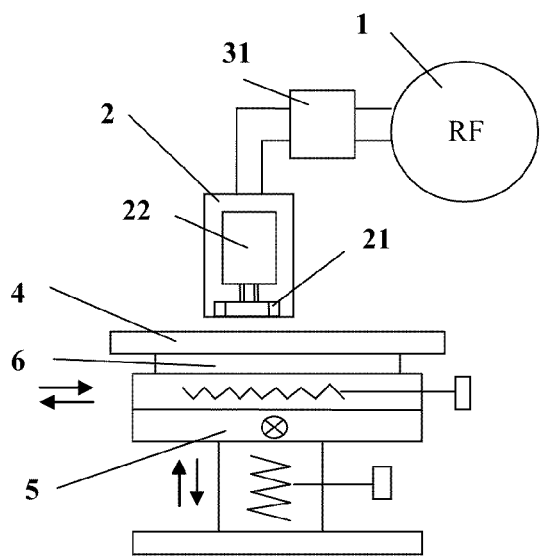
FIG. 3 shows the set-up of the RF/microwave apparatus for rapid heating of target materials.

Still referring to FIG. 2, the RF/microwave heating head 2 consists of a match-up network 22 and a heating head coupler 21. The heating head coupler 21 may be either an inductive coil or a pair of capacitive electrodes. RF/microwave power generated from the power source 1 is forward to the RF/microwave heating head coupler 21 through a directional coupler 33, a circulator 34, and a match-up network 22. The heating head coupler 21 is closely placed on the top of the targeted specimen 4 which is held and moved by a three dimensional stage (shown in detail in FIG. 3). The specimen is separated from the stage by an insulator plate to minimize the thermal loss.

RF/microwave energy can be dissipated to the target specimen through the heating head coupler using either an inductive coupling method or a capacitive coupling method. The inductive coupling method is preferred in heating high conductive thin film such as metals or highly doped impurity layers in silicon wafers. The capacitive coupling method is preferably to be used for materials with high dielectric loss of ∈" such as glass and ceramics.

Figure 4:
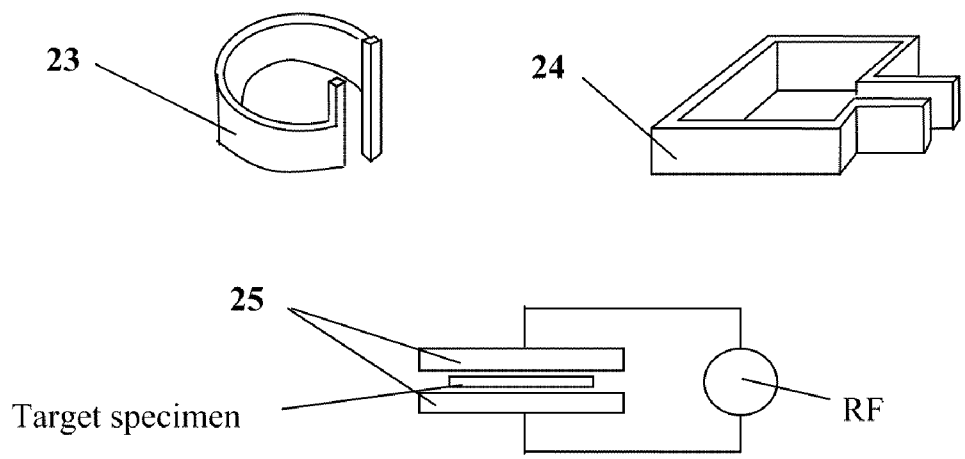
FIG. 4 shows the inductive coils and capacitive electrodes used in RF/microwave heating head coupler.

The structure and configuration of the RF/microwave heating head coupler needs to be specially designed according to the shape, dimension and electric properties of target materials for achieving optimal coupling efficiency and high heating rate. Examples of inductive coils and capacitive electrodes used in the RF/microwave heating head coupler in the present invention are illustrated in FIG. 4. The shape and size of the coils may vary with the shape and size of the targeted area such that the best match and an optimal coupling efficiency can be achieved. The number of coil turns is preferably one turn or less when the driving frequency is higher than 500 MHz. The coil may have two turns or less when the driving frequency is between 100 MHz to 500 MHz. In general, the effective electrical length of the coils is less than about ¼ the wavelength of the driving frequency applied. More preferably, the effective electrical wavelength is less than 1/10 of the wavelength.

Figure 5:
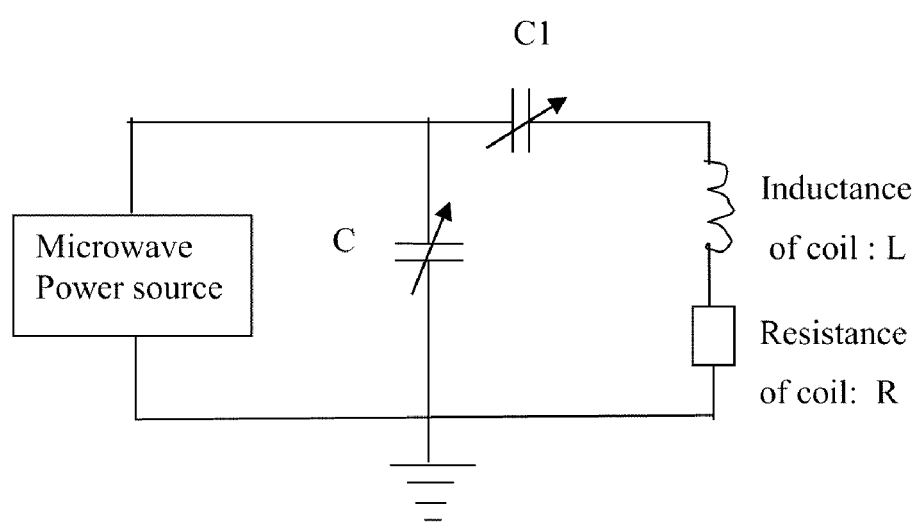
FIG. 5 is an equivalent circuit diagram of the heating head.

The match-up network 22 is used to tune both resonant frequency and impedance of the loaded RF heating head to match with those of the RF/microwave power source. An equivalent circuit diagram of the heating head of the present invention is shown in FIG. 5, where L and R are the inductance and resistance of an inductive coil, respectively. C1 and C2 are two capacitive elements of a split capacitor network in the match-up network. They are used to tune both resonant frequency and impedance of the loaded inductive coil to match with those of the RF/microwave power source. A match of the resonant frequency and impedance between the RF/microwave source and the loaded heating head circuits is crucial for achieving rapid heating. The optimal design of a match-up network varies with applications. The selection of the component parameters of L, C1 and C2 depend on both the properties of materials and dimensions of the load specimens. The resonant frequency $\omega_0$ of this heating head can be calculated from Equation (1):

$$\omega_0^2 = 1/L(1/C_1 + 1/C_2) \quad (1)$$

Control and Measurement System

Referring again to FIG. 2, the measurement and control system consists of a directional coupler 33, circulator 34, RF probes 35, power meters 36, optical temperature measurement device (pyrometer) 37, Network Analyzer 31 and a PC computer 32. The directional coupler 33 and RF probes 35 are used to detect the transmitted and reflected microwave power. The detected signals are sent to RF power meters 36 and a microwave network analyzer 31 for monitoring the coupling of microwaves to the target materials. The optical pyrometer 37 is used to record the target temperature. All microwave and temperature data are input into a PC computer 32 where the measured parameters are instantly displayed as time dependent functions on the computer monitor.

Key Advantages of RF/Microwave Rapid Heating Apparatus

It is known that the heating rate depends on how efficiently the RF/microwave energy can be coupled into the targeted materials. The RF/microwave apparatus of the present invention has the following key advantages to overcome the limitation of prior art in microwave heating techniques.

According to one aspect of the invention, inductive coupling and capacitive coupling methods are used to replace the cavity coupling method of the prior art to transfer RF/microwaves from a source to loaded specimens. The inductive coupling is good for thin conductive materials such as metal film or impurity doped silicon wafer where the magnetic field will induce an eddy current in the thin metal film to heat it rapidly. The capacitive coupling is good for dielectric materials such as glass and ceramics where the rapid heating is induced by the electric field.

The use of inductive coupling and capacitive coupling in the RF/microwave head of the present invention is one of the key factors to providing many advantages over the cavity coupling method used in prior art. These advantages are: (1) different coupling mechanisms are used for different materials so the coupling efficiency is optimized; (2) the RF/microwave head can be closely placed on the top of the targeted heating area so the heating areas are exposed in the strongest electromagnetic filed; (3) the configuration of the conductive coil or capacitive electrodes in the RF/microwave head coupler can be specially designed to match the pattern of the heating areas so intense RF/microwave energy is only delivered to the focused areas while no other area will be affected by RF/microwave radiation; (4) there is no arcing or plasma breakdown problem, which means the inductive coupling method can deliver significantly higher power density to the load than the cavity coupling method can. As a result, significantly higher heating rate and higher heating temperature can be achieved; and, (5) there is no limitation on the size of the load.

According to another aspect of the invention, variable frequency solid state electronics, instead of a fixed frequency magnetron, are used as the RF/microwave power source in the present invention. This allows a broad range of bandwidths from which to choose the optimal operating RF/microwave frequency. It also provides the flexibility of sweeping the source frequency during the thermal processes to compensate the resonant frequency shift of the load caused by the temperature change of the specimen. In addition, the variable frequency source has the capability of generating pulsed or modulated microwave power for optimal energy dissipation. In comparison with the TWT variable frequency source used in prior systems, the solid state electronic source is much cheaper, more compact and easier for electronic control.

According to another aspect of the invention, a match-up network is specially designed for tuning both resonant frequency and impedance of the loaded heating head to match with those of the RF/microwave power source. The L and C parameters for the components in the heating head can vary with the targeted specimens in order to maintain excellent coupling conditions for different applications. In contrast to the slow mechanical tuning of RF/microwave cavities in the prior art, the L and C components can be electronically tuned so that there is no delay in tuning response time and a much higher heating rate can be achieved.

According to another aspect of the invention, a network analyzer and PC computer are introduced in the measurement system for monitoring, tuning and controlling the entire RF/microwave and thermal process. Since the rapid thermal processes must be completed in a very short time, e.g. a few seconds or less, it is very hard to tune and to control the processes manually. The combination of hardware and software realizes an automated measurement and control system with real-time feedback, which provides further flexibility, stability and reliability to the overall system.

Tuning RF/Microwave Apparatus to an Optimal Coupling Condition.

Figure 6:
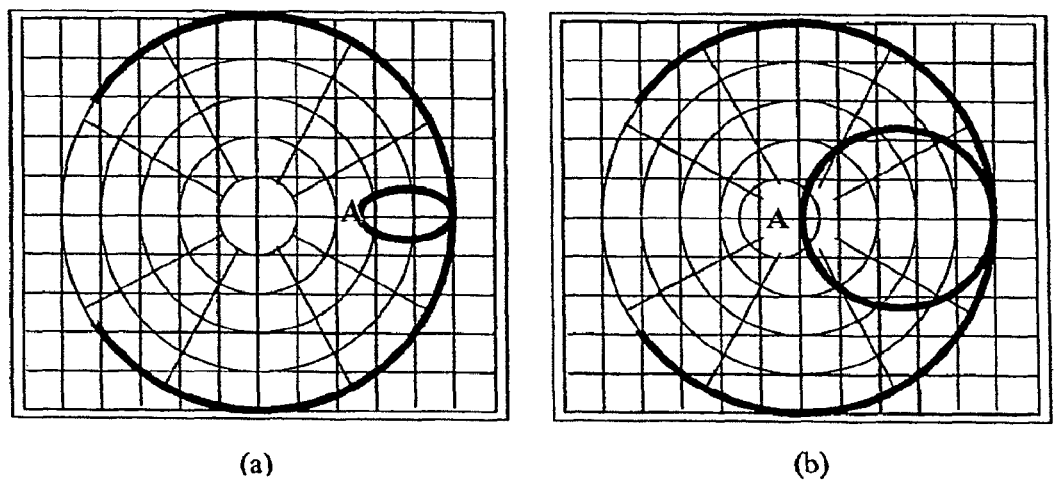
FIG. 6(a) is a Smith chart graph for reflective coefficient and complex impedance displayed on the screen of a Network Analyzer before tuning (not in an optima coupling)
FIG. 6(b) is a Smith chart graph for reflective coefficient and complex impedance after tuning (optimal coupling is achieved)

Since the heating rate depends on how efficiently the RF/microwave energy can be coupled into the materials. The RF/microwave system must be tuned in excellent match conditions for both the resonant frequency and the impedance between the RF/microwave source and the load. This is accomplished by a small signal test before applying high RF/microwave power to run the rapid heating process. Referring to FIG. 2, in a small signal test, the signal generator 11 is operating in a sweep oscillating mode with a low level signal output, e.g. 1 dbm. The coupling condition is monitored by the network analyzer 31, which displays an impedance curve on a Smith chart as shown in FIG. 6(*a*). By tuning the capacitances of C1 and C2 in the match-up network 22 and the relative position between the specimen 4 and the heating head coupler 21, an optimal condition can be reached when the nose of the impedance curve is brought to the center of the Smith Chart as shown in FIG. 6(b). At this point, the RF/microwave system has been tuned to the best coupling condition with minimum microwave reflection. The frequency marked at the nose point is the exact resonant frequency of the microwave system.

Processes of RF/Microwave Rapid Heating

Once the RF/microwave system is tuned to the optimal coupling condition after a small signal test, RF/microwave power at the system resonant frequency can be applied to the target either in a form of a continuous wave (CW) or a series of pulsed waves. The target will be rapidly heated up and held at the processing temperature for the required time. The whole process can be controlled either manually or electronically. The running time and RF/microwave power level for heating processes varies with the requirements of applications and needs to be determined via experimental tests.

Since the resonant frequency and impedance may shift during the process due to the temperature change of specimens, the coupling conditions may be improved if the operating frequency can sweep over a narrow frequency range of $\Delta F$ during the heating period where $\Delta F$ is the frequency shifting caused by the temperature change.

Methods for Microwave RTP of Semiconductors and Materials

Microwave RTP for SiC Wide Bandgap Semiconductors

One embodiment of the present invention is to teach a method for RF/Microwave rapid thermal processing of SiC wide bandgap semiconductor. It is known that the temperature required for post-implant annealing of SiC semiconductor ranging from 1500 to 2000° C., and a short annealing time ranging from a few minutes to a few seconds. Microwave rapid heating tests for SiC wafers were performed using the RF/microwave apparatus of this invention.

A SiC specimen of 6×6×0.4 mm sliced from a Cree 4H—SiC wafer was placed under an inductive heading head. The size of the inductive coil inside the heating head is about 8×8×5 mm which was designed to be very close to the size of target specimen so high microwave coupling efficiency can be achieved. From a small signal test, the resonant frequency of the loaded microwave system is measured as 402 MHz. The impedance match between the load and source is accomplished by tuning the adjustable capacitors in the match-up network with minimal microwave reflection.

An HP 8505A network analyzer is used as a signal generator as well as the microwave measurement equipment. Once the microwave power is turned on, the signal output of 402 MHz from the HP 8505A is amplified by a Kalmus LA300UM power amplifier. The microwave power is transmitted to the heating head through a directional coupler of Nader model 3020A. The transmitted and reflected microwave power are measured using two HP 8481A RF probes and two HP 436A power meters. An Ircon 710C pyrometer is used for temperature measurement. All the measured microwave and temperature parameters are inputted and stored on a PC using NI 4351 and Virtual Bench, both products of National Instruments.

Figure 7A:
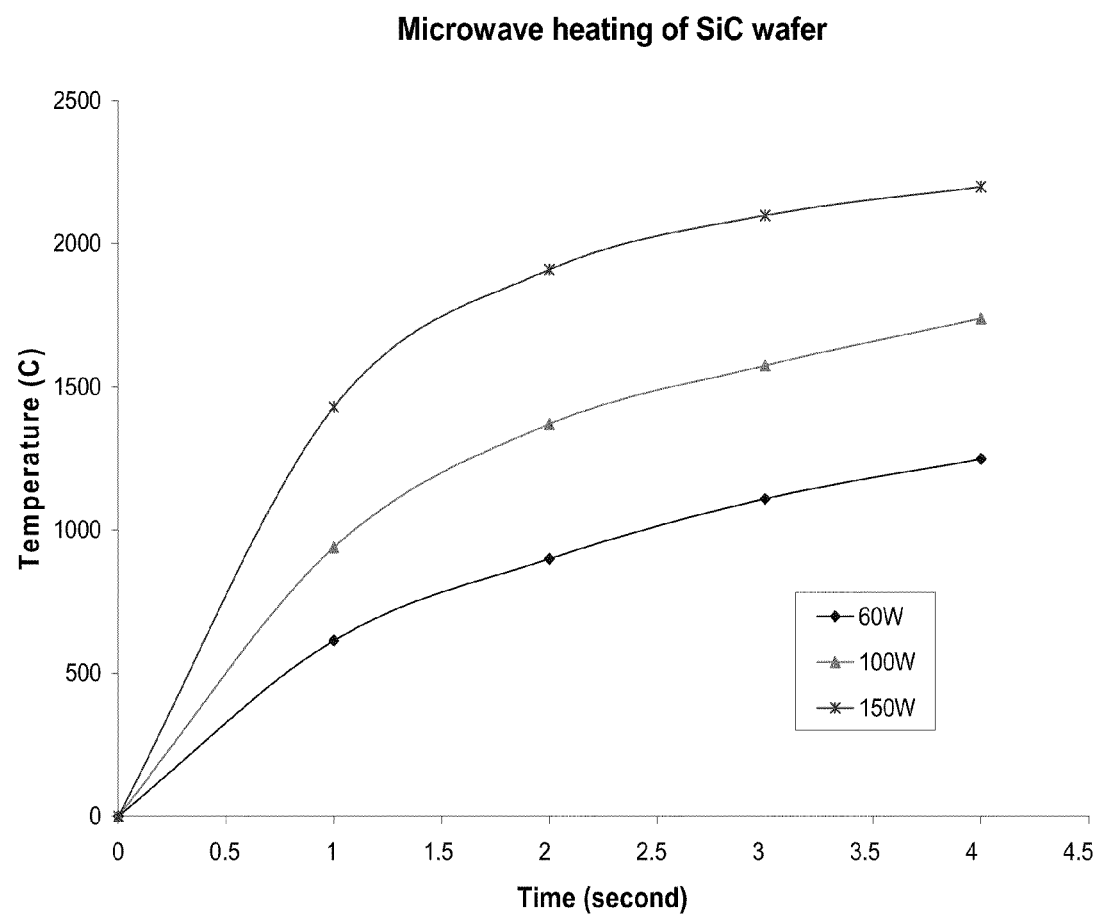
FIGS. 7(a)&(b) are graphs showing the heating rate of SIC and silicon wafers achievable with the present apparatus; and, FIG. 8 shows heating rate charts of SiC and silicon wafers that are achievable with the present apparatus.

The typical temperature profiles are shown in FIG. 7(a). The data for variation of temperature with time and input microwave power are listed in Table 1 of FIG. 8. As can be seen from the data, it took about 1 and 4 seconds for a SiC specimen to reach the temperatures of 1400° C. and 2200° C. respectively with 150 W input power. The average heating rate varies from 1400° C./sec to 550° C./sec depending on the target temperature. This experiment demonstrated that the microwave system of this invention has the capability of reaching ultra-high temperature of over 3000° C. within seconds. Such capability is crucial for RTP of ion implanted SiC wafers in order to achieve low sheet resistance and small surface roughness.

Microwave RTP for Fabrication of Si-CMOS Ultra-Shallow Junction.

Figure 7B:
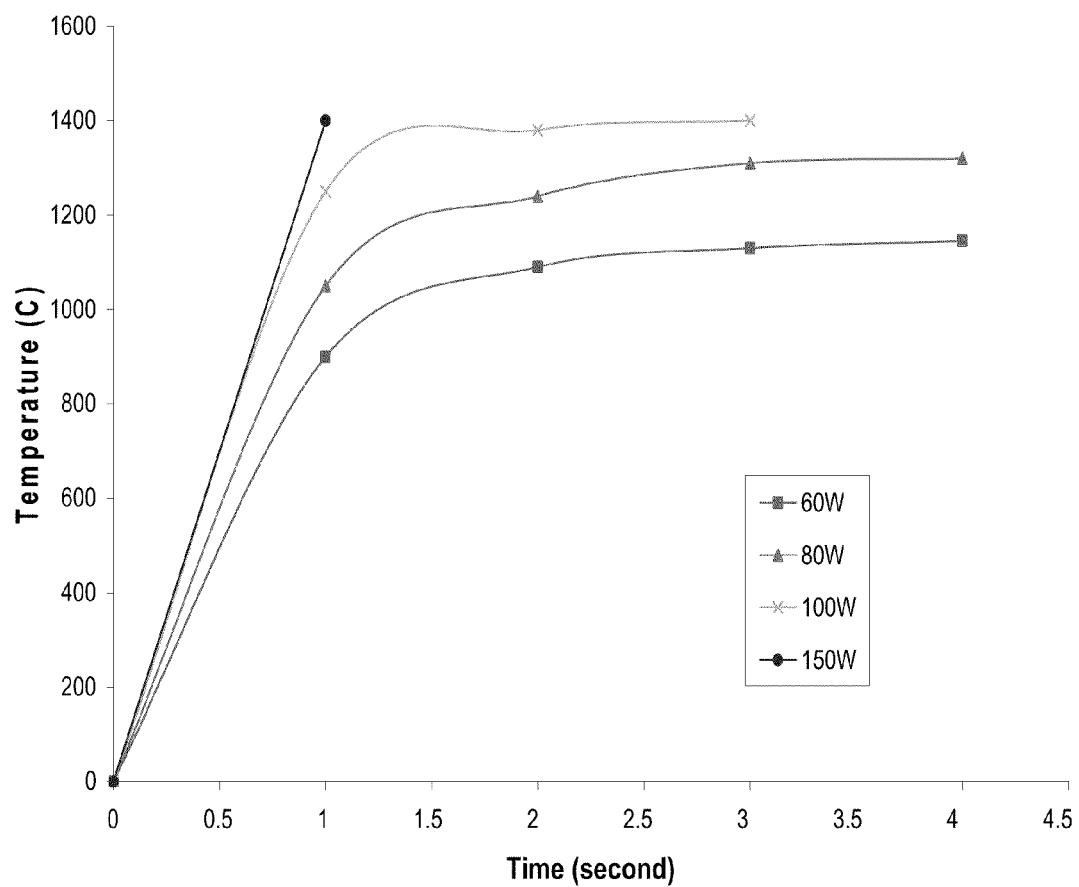

Another embodiment of the present invention is to teach a method for fabrication of Si-CMOS ultra-shallow junction (USJ) using the RF/microwave apparatus of this invention. It is known that fabrication of next generation Si nano-scale devices requires new RTP capabilities of ultra-high heating and cooling rates from 100° C./sec to well above 1000° C./sec. Experiments for microwave rapid heating of As doped Si wafers have been performed using the microwave RTP apparatus of this invention. The sample material is a N type silicon wafer heavily doped with As impurities. It has very low resistivity of 0.001 to 0.004 ohm-cm. The specimens of 6×6×0.4 mm were closely placed under the inductive heading head and various microwave powers at a frequency of 406 MHz is applied to rapidly heat the As doped Si specimens. The set-up of microwave apparatus and the process method are very similar to that for rapid heating of SiC wafers. The typical temperature profiles are shown in FIG. 7(b). The data for variation of temperature with time and input microwave power are listed in Table 2 of FIG. 8. It can be seen that the heating rate of over 1000° C./second was achieved at power level above 80 W and it only took one second to heat the Si wafer to its melting temperature of 1410° C. at power level of 150 W. These results demonstrate that the microwave apparatus of the present invention is capable of rapidly heating of Si wafer to near silicon melting temperature at ultra-high heating rate of over 1000° C./second. However, these experiments were carried out using a microwave source with continuous sine waveform which is relatively slow in transient power rising and thus may limit the heating rate. The heating rate may be significantly increased if a pulsed type of microwave source with the capability to supply peak power at much higher levels can be used. The approaches in the direction of using high power pulsed microwave sources have great potential in meeting the challenges of RTP of next generation CMOS ultra-shallow junctions.

Method for Microwave Bonding and Sealing of Mems and IC Devices

Another objective of the present invention is to teach a new approach of bonding and sealing of mems and IC devices using RF/microwave rapid and selective heating apparatus of this invention. This new approach will allow the use of bonding materials of high melting temperatures or chemical resistance such as noble metals for strong bonding and hermetic sealing of mems and IC devices. The new approach also can eliminate the solder bumps in flip-chip and BGA bonding of IC devices to achieve significantly higher interconnect density.

The basic idea of the new approach aims to provide high temperature in a confined region of the bonding interface using RF/microwave rapid and selective heating so strong bonding can be achieved for bonding mems and IC components, while keeping the temperature low at wafer level so the microstructures and microelectronics which are already there can be preserved. The two key aspects for this new approach are: (1) heating must be selective so only the targeted area to be heated; and, (2) heating must be fast so there is no time for the heat to spread outside of the targeted heating area. The RF/microwave apparatus of the present invention has the capability to perform both the two key functions.

Rapid and Selective Heating Tests for Heterostructure.

Another embodiment of the present invention is to perform rapid and selective heating tests for heterostructure of a gold thin film coated silicon wafer using the method and apparatus of the present invention. The basic mechanism of microwave selective heating is based the variation of microwave absorption in a heterostructure, a structure which comprises of a strong microwave absorber and a poor microwave absorber. Microwaves will selectively heat up the strong microwave absorber while leaving only negligible heating effect on the materials of low microwave absorption. Gold has very high electrical conductivity so it is a strong microwave absorber. The conductivity of silicon substrate is low so it is a weak microwave absorber.

Figure 9:
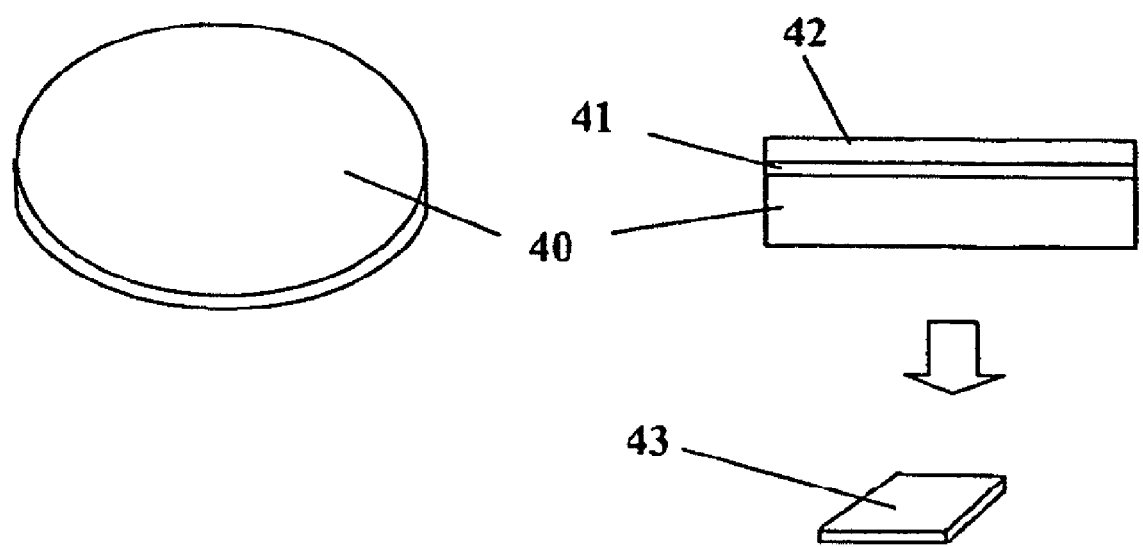
FIG. 9 is a gold thin film coated silicon wafer.

Referring to FIG. 9, a 20 nm thin layer of Cr film 41 is first deposited on a 4" Silicon wafer 40 followed by the deposition of the second 0.3 μm layer of gold film 42. Both Cr and Au thin films are coated using PVD sputtering deposition technique. The gold coated wafer 40 is then sliced into small square specimens 43 with a dimension of 8×8×0.4 mm.

Figure 10:
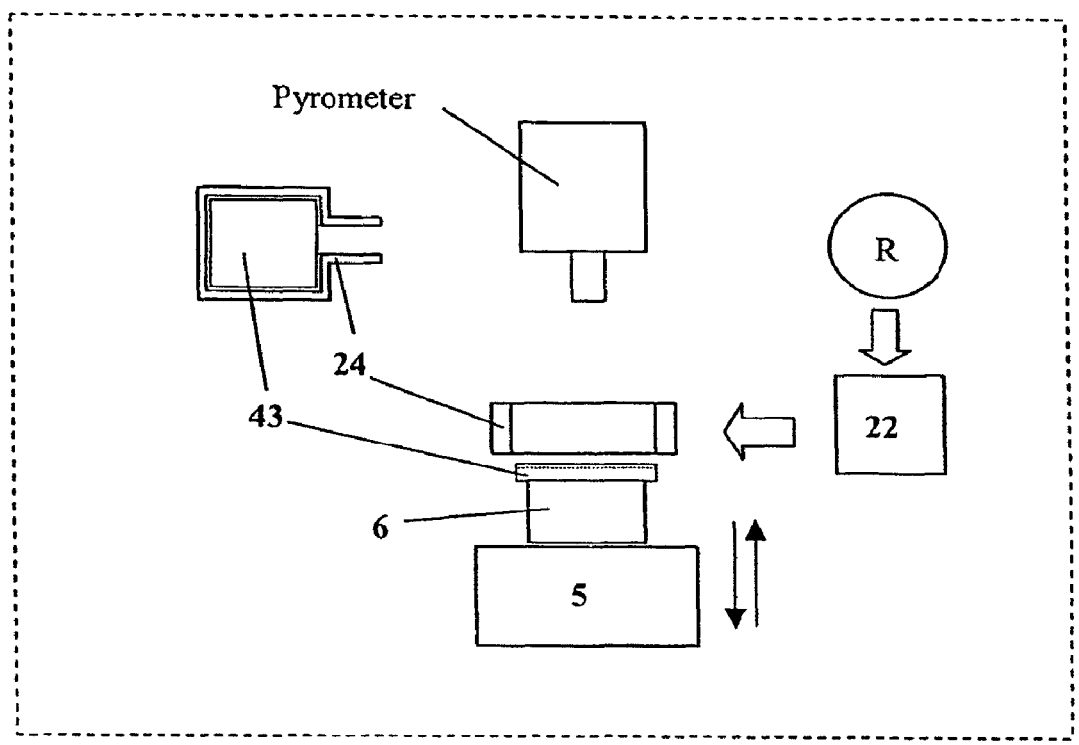
FIG. 10 shows the configuration and dimensions of an inductive coil for rapid heating tests.
Figure 11:
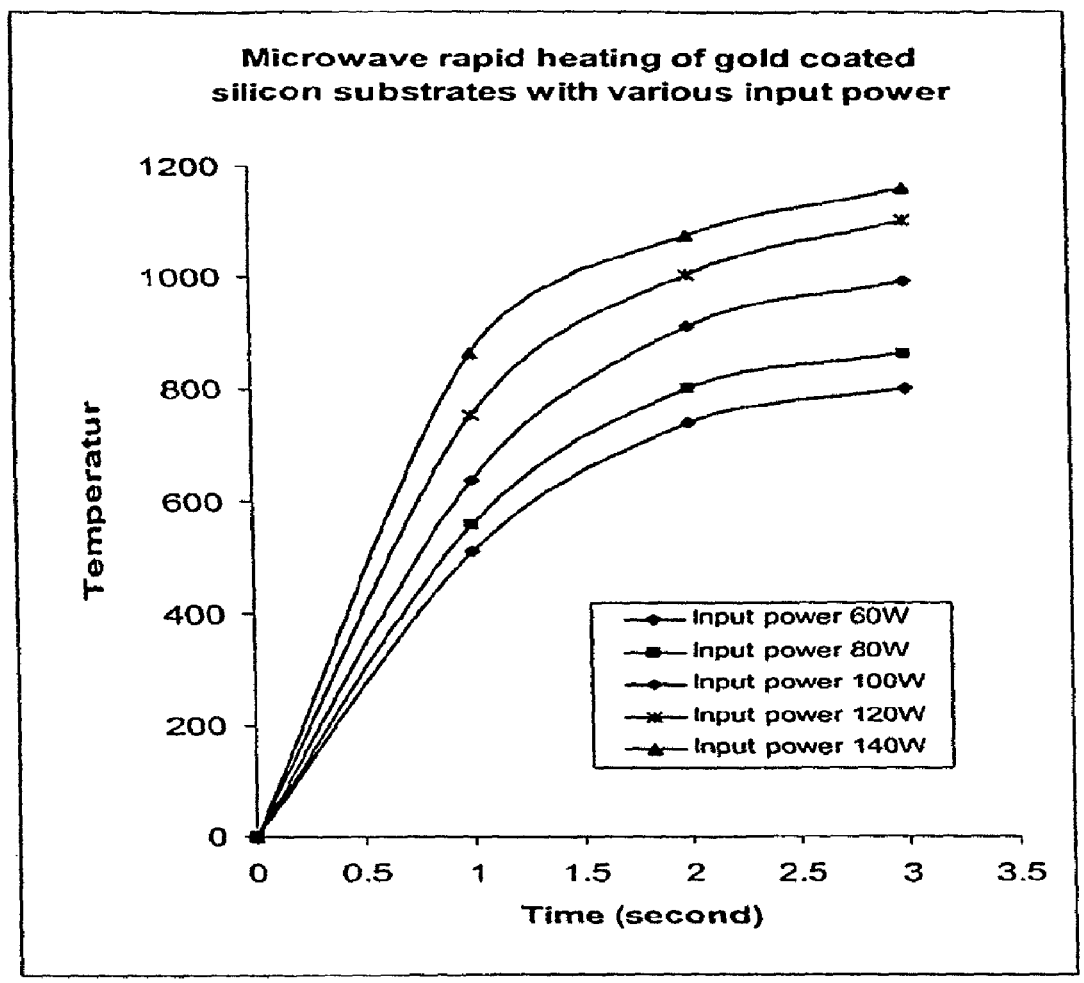
FIG. 11 is a graph that shows the RF/microwave rapid heating of heterostructure of a gold coated silicon substrate heterostructure.

Referring to FIG. 10, a gold coated silicon specimen 43 is closely placed under an inductive coil 24. The size of the coil 24 is about 10×10×5 mm and was designed to be very close to the size of target specimen 41 so high microwave coupling efficiency can be achieved. Various microwave powers at a frequency of 906 MHz was applied to rapidly heat the gold thin film coated Si specimen. The set-up of microwave apparatus and the process method are very similar to that for rapid heating of SIC wafers except the power amplifier of Kamuls LA300UM was replaced by a Decibel C903 power amplifier Typical temperature profiles for microwave rapid heating of gold coated silicon substrates are illustrated in FIG. 11. The gold's melting temperature of 1064° C. was reached within 2-3 seconds with input microwave power of 120-140 W. A heating rate of 300° to 800° C./second is achieved. The detailed experimental data for the variation of temperature with time and input microwave power are listed in Table 3 of FIG. 12. The results of this rapid heating test demonstrates that the microwave apparatus of the present invention is capable of rapid and selective heating of materials to high temperatures above 1000° C. with a high heating rate of 300 to 800° C./sec.

Microwave Bonding of Mems Components with Gold Interlayer

Figure 13:
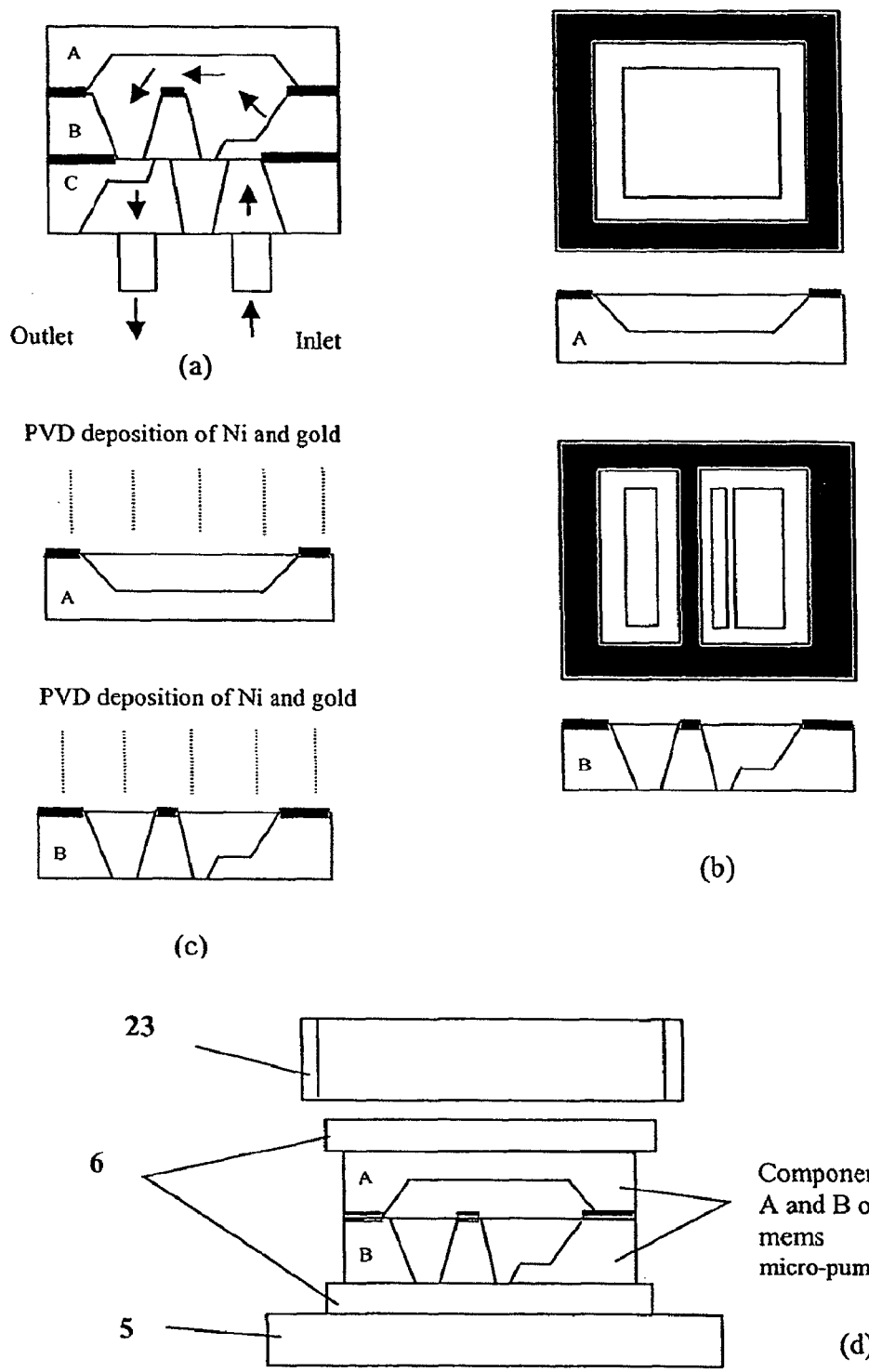
FIG. 13 shows RF/microwave rapid bonding of two mems components, wherein (a) is a cross section of a mems micropump; (b) shows the pattern of the bonding areas for the components; (c) shows PVD sputtering deposition; and, (d) shows the stacking-up and alignment of the components for RF/microwave rapid bonding.

Another embodiment of the present invention is to perform bonding of two silicon components of mems micro-pump with gold interlayer using microwave rapid heating apparatus of this invention. FIG. 13(a) illustrates the cross section of a micro-pump which will be used for bio-medical applications. The micro-bump is fabricated by bonding three components of silicon substrates A, B and C together. The proper function of the micro-pump requires high bonding strength, hermetic sealing and corrosion resistance at the gray areas of the bonding interface. Microwave rapid bonding tests were performed for components using gold as the bonding material because of gold's excellent corrosion resistance.

Referring to FIG. 13(b), silicon wafers A and B are formed by micro-machining techniques and sliced into small specimens in a dimension of 6 mm×6 mm×0.4 mm. The grey areas represent the pattern of bonding interface on which gold thin films are deposited by PVD sputtering and lithographic methods. The PVD deposition processes are schematically shown in FIG. 13(c). A 20 nm thin layer of Cr film is first deposited on the bonding areas, followed by the deposition of the second 0.3 μM layer of gold film. The two silicon substrates are stacked up with the gold coated areas face to face along with the alignment of the bonding areas as shown in FIG. 13(d).

The two stacked substrates form a heterostructure where the gold is a strong microwave absorber and the silicon substrate is a weak microwave absorber.

The RF/microwave rapid bonding process is very similar to that of RF/microwave rapid and selective heating tests for gold thin film coated silicon wafers. A circular inductive coil 23 (shown in FIG. 4) with a diameter of 10 mm is placed on the top of the bonding area. Microwave power of 898 MHz is coupled to the bonding target through the inductive coil 23. Since the silicon substrate is low dielectric loss material and a weak microwave absorber, the input microwave power can penetrated through the top silicon substrate and dissipated in the thin gold layers in the middle of the sandwiched mems components through an induced eddy current. It takes about 3 to 6 seconds to firmly bond the two components A and B of the mems micro-pump with microwave power level of 120 to 140 watts.

Figure 14:
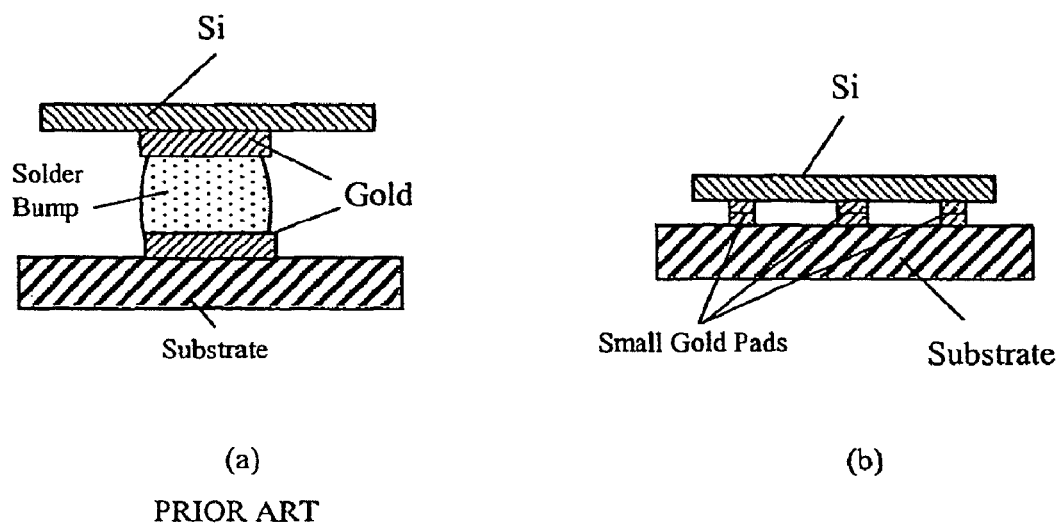
FIG. 14(a) shows a traditional (prior art) flip chip bonding with solder bump.
FIG. 14(b) shows solderless RF/microwave direct bonding of small gold pads for high IC interconnect density.

Solderless Flip-Chip and Ball Grid Array (BGA) Bonding of IC Chips for High Interconnect Density Another objective of the present invention is to teach a way of eliminating solder bumps in flip-chip and BGA bonding of IC chips for high interconnect density. As the demand on miniaturization and functionality increases, higher-density interconnection and higher number of I/Os are needed to keep up with the device complexity. The large space occupied by the metal solder bumps, as shown in FIG. 14(a), becomes a limiting factor for further shrinkage of the IC package. RF/microwave bonding can meet the challenge of high interconnect density by directly bonding gold pads on chip to gold pads for pins without solder balls. Since RF/microwave bonding is stronger than solder bonding, the size of pads can be reduced, which will result in significantly higher interconnect density. For instance the ball size of a traditional flip chip bond, as shown in FIG. 14(a), is about 200-1000 μm, while for RF/microwave bonding, the size of the pads may be as small as 20-30 μm, as shown in FIG. 14(b).

The process for RF/microwave solderless gold pad to gold pad direct bonding is similar to that of mems metal bonding. An induction head can be placed on the top of IC microchip and eddy currents will be induced in the gold coated pads. The two pads will be bonded when the melting temperature of 1065° C. is reached. The heating rate must be very fast so the bonding can be completed in a very short time. Only the interface of the pads is melted while other parts of the IC microchip are still cool and the microcircuits in the IC chip are unaffected.

The method and apparatus of the present invention may introduce several new opportunities, including: (1) much higher temperatures can be applied to improve the bonding strength; (2) new bonding mechanisms such as brazing and fusion bonding, and new bonding materials, such as noble metals of Au, Ag, Cr, Ni, Pt and SiO$_2$ based glass can be used; (3) no pressure needs to be applied to the specimens during bonding which can significantly reduce the residual stress related damages; and, (4) bonding is not limited to the outside surface of the body. Microwaves can penetrate into non-conductive or low conductive materials to perform bonding inside the body as demonstrated in the bonding of sandwiched mems components described above. (5) a new direct gold pad to gold pad bonding method for solderless Flip-Chip and Ball Grid Array (BGA) Bonding of IC Chips to achieve significantly higher interconnect density The foregoing description of the specific embodiments will so fully reveal the general nature of the invention that others can, by applying current knowledge, readily modify and/or adapt for various applications such specific embodiments without departing from the generic concept. Therefore, such adaptations and modifications should and are intended to be comprehended within the meaning and range of equivalents of the disclosed embodiments. It is to be understood that the phraseology of terminology employed herein is for the purpose of description and not of limitation.

We claim:

1. A method for rapid heating of materials, the method comprising:
providing an apparatus including a variable high frequency microwave power source, a microwave heating head, and a measurement and control system, wherein the microwave heating head includes a heating head coupler for coupling microwaves to a material to be heated and an electronic match-up network including inductive (L) components and capacitive (C) components for tuning a resonant frequency and an impedance of the heating head coupler;
selecting an appropriate heating head, based on a type of material to be heated, wherein the selecting an appropriate heating head includes:
   selecting an inductive coil as the heating head, when the type of material to be heated includes one of high conductive thin films and semiconductors; and
   selecting two capacitive electrodes as the heating head, when the type of material to be heated includes one of dielectric material, glass and ceramics;
placing the material to be heated at a position proximal to the selected heating head, thus loading the heating head such that the material to be heated is maximally exposed to a microwave power from the heating head;
electronically adjusting the microwave power source and the L and C parameters of the match-up network so that a characteristic frequency and an impedance of the loaded heating head are optimally matched with a characteristic frequency and an impedance of the microwave power source such that the microwave power from the heating head is focused upon selected portions of the material to be heated;
generating microwaves within the microwave power source;
applying the microwave power to the material to be heated, thus heating the material;
adjusting the microwave power source and the heating head during heating of the material so as to compensate for any frequency and impedance shifting of the heating head caused by a temperature change in the material during heating; and
controlling a microwave power waveform to heat the material to a predetermined heating temperature at a predetermined heating rate using the measurement and control system;
wherein the apparatus is capable of achieving a heating rate of 10-2000° C./second for high conductive films and semiconductors and does not heat the material in a microwave cavity; and
wherein the microwave power source can sweep a predetermined bandwidth within a frequency range from 300 MHz to 20 GHz.

2. The method of claim 1, wherein the materials to be heated are selected from the group consisting of semiconductors, high conductive films, dielectric materials, glass and ceramics.

3. The method of claim 1, wherein the materials to be heated are semiconductors selected from the group consisting of Silicon, Silicon Carbide and Gallium Nitride.

4. The method of claim 1, wherein the materials to be heated are semiconductors selected from the group consisting of ion-implantation doped Silicon, Silicon Carbide, Gallium Nitride and Silicon based metal-oxide-semiconductor ultra-shallow-junction.

5. The method of claim 1, wherein the materials to be heated are high conductive films selected from the group of metallic thin films consisting of Gold, Silver, Copper, Nickel, Chromium and Platinum.

6. The method of claim 1, wherein:
the heating head coupler includes an inductive coil having a number of turns, and two capacitive electrodes,
the number of turns in the inductive coil is one or less when the driving frequency is higher than 500 MHz,
the number of turns in the inductive coil is two or less when the driving frequency is between 300 MHz and 500 MHz, and
an effective electric length of the induction coil is less than a quarter of a wavelength of an applied driving microwave frequency.

7. The method of claim 1, wherein:
the electronic match-up network includes at least one inductive component and two capacitive components, and
the two capacitive components are connected in the form of a split capacitor network and each capacitive component has a variable capacitance.

8. The method of claim 1, wherein the placing the material to be heated at a position proximal to the selected heating head further comprises:
placing the material to be heated at a position where a magnetic field is maximized, when the selected heating head is the inductive coil; and
placing the material to be heated at a position where an electric field is maximized, when the selected heating head is the two capacitive electrodes.

9. The method of claim 1, wherein the microwave power source comprises a solid state electronics based microwave signal generator and a solid state electronics based microwave power amplifier, and wherein a driving frequency of the microwave power source is greater than 300 MHz.

10. The method of claim 1, wherein the microwave power source is able to generate a continuous waveform, a pulsed waveform, and a modulated waveform.

11. The method of claim 1, wherein the measurement and control system comprises: an optical temperature sensor for monitoring the heating temperature; microwave probes and power meters for detecting the transmitted and reflected microwave power; and a network analyzer and a PC based control system for electronically controlling the heating of the material.

12. The method of claim 7, wherein the adjusting the microwave power source and the heating head further comprises:
determining a resonant frequency and an impedance of the loaded heating head using a network analyzer included with the measurement and control system;
adjusting the frequency of the microwave power source and adjusting the inductive component and the capacitive components of the match-up network in the heating head, so that the frequency and impedance of the microwave power source matches, respectively, the resonant frequency and impedance of the loaded heating head.

13. The method of claim 7, wherein the generating microwaves and the applying the microwave power to the material to be heated further comprise:
generating microwave power at a predetermined resonant frequency of the material to be heated;
applying the microwave power to the material to be heated;

adjusting a frequency of the microwave power source so as to compensate for any resonant frequency shifting of the loaded heating head caused by a temperature change of the material during heating;

adjusting the inductive component and the capacitive components of the match-up network to compensate for any frequency and impedance shifting of the loaded heating head caused by a temperature change of the material during heating; and heating the material to a predetermined temperature at a predetermined heating rate controlled by the measurement and control system.

14. The method of claim 13, wherein the controlling a microwave power waveform to heat the material to a predetermined temperature at a predetermined heating rate further comprises:

Electronically modulating the microwave power waveform using a PC based control system so as to control the heating rate and the heating temperature to meet the predetermined heating rate and heating temperature.

15. The method of claim 13, wherein the controlling a microwave power waveform to heat the material to a predetermined temperature at a predetermined heating rate further comprises:

Manually pulsing an output of the microwave power so as to control the heating rate and the heating temperature to meet the predetermined heating rate and heating temperature.

* * * * *